(12) United States Patent
Ferianz

(10) Patent No.: US 10,608,628 B2
(45) Date of Patent: Mar. 31, 2020

(54) DRIVE CIRCUIT FOR A TRANSISTOR COMPONENT

(71) Applicant: Infineon Technologies Austria AG, Villach (AT)

(72) Inventor: Thomas Ferianz, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/181,140

(22) Filed: Nov. 5, 2018

(65) Prior Publication Data

US 2019/0140638 A1    May 9, 2019

(30) Foreign Application Priority Data

Nov. 8, 2017  (DE) .................. 10 2017 126 060

(51) Int. Cl.
*H03K 3/023* (2006.01)
*H03K 17/687* (2006.01)
*H03K 17/14* (2006.01)
*H03F 3/45* (2006.01)

(52) U.S. Cl.
CPC ....... *H03K 17/687* (2013.01); *H03F 3/45475* (2013.01); *H03K 3/023* (2013.01); *H03K 17/145* (2013.01); *H03F 2203/45544* (2013.01); *H03F 2203/45594* (2013.01); *H03K 2217/0081* (2013.01)

(58) Field of Classification Search
CPC ..... H03K 3/023; H03K 17/145; H03K 17/687
USPC .............................. 326/82, 83; 327/108, 109
See application file for complete search history.

(56) References Cited

U.S. PATENT DOCUMENTS

| | | | | |
|---|---|---|---|---|
| 4,645,986 A | * | 2/1987 | Melbert | H03K 4/64 315/387 |
| 4,864,214 A | * | 9/1989 | Billings | H03K 17/04213 323/289 |
| 5,999,470 A | * | 12/1999 | Takahashi | G11C 7/065 365/207 |

FOREIGN PATENT DOCUMENTS

DE    102006061496 A1    3/2004

OTHER PUBLICATIONS

Office Action, in the German language, from counterpart German Application No. 102017126060.9, dated Oct. 17, 2018, 4 pp.

* cited by examiner

*Primary Examiner* — William Hernandez
(74) *Attorney, Agent, or Firm* — Shumaker & Sieffert, P.A.

(57) ABSTRACT

A drive circuit for a transistor component is described. The drive circuit comprises: an output, which is designed to be connected to a drive input of a transistor component and which has a first output node and a second output node; an input, which is designed to receive an input signal, which is referred to a reference potential, and which has a first input node and a second input node; a differential amplifier arrangement, which is connected to the first input node, the second input node, and the second output node, and which is designed to generate a drive signal based on the input signal; and a driver circuit, which is designed to receive the drive signal and to generate a drive voltage between the first and second output node based on the drive signal.

22 Claims, 9 Drawing Sheets

DRIVE CIRCUIT FOR A TRANSISTOR COMPONENT

This Application claims priority to German Application Number 102017126060.9, filed on Nov. 8, 2017, the entire content of which is incorporated herein by reference.

This application relates in general to a drive circuit for a transistor component, in particular a power transistor component.

Transistors, such as, for example, MOSFETs (metal-oxide-semiconductor field-effect transistors) are voltage-controlled components that switch on or off depending on a voltage applied to a drive input.

The drive input can comprise a control terminal and a first load terminal of the transistor, which, in the case of a MOSFET, are usually referred to as gate terminal and source terminal. However, there are also transistors, in particular power transistors, in which the drive input comprises the control terminal and a further control terminal and the first load terminal and a second load terminal are additionally present. In the case of a MOSFET, the additional control terminal is usually referred to as a Kelvin source terminal.

Power transistors are transistors having a dielectric strength of several tens of volts (V) up to several hundreds of volts (V), such as, for example, 600 V or 750 V. Power transistors of this kind usually comprise a semiconductor chip and a housing, in which the semiconductor chip is arranged. Active component regions are integrated in the semiconductor chip. The control terminals and load terminals mentioned above are terminals that are accessible from outside the housing and that are connected inside the housing to the active components integrated in the semiconductor chip. For example, in the case of a MOSFET, a source terminal, which forms a first load terminal, is thus connected to at least one source region, which is integrated in the semiconductor chip, a drain terminal, which forms a second load terminal, is connected to at least one drain region, which is integrated in the semiconductor chip, and a gate terminal, which forms a control terminal, is connected to a gate electrode, which is integrated on or in the semiconductor body. In the case of a MOSFET having a Kelvin source terminal, which forms a further control terminal, said terminal is likewise connected to the at least one source region.

The connecting lines between the terminals of the housing and the semiconductor chip usually form a parasitic inductance, with the result that voltages can be induced in said connecting lines when the current in said connecting lines changes. Extreme changes in current occur in a power transistor during switch-on and switch-off, in particular, in the load path, that is to say the stretch between the two load terminals. When a further control terminal is provided in addition to the first load terminal, the transistor can be driven in a manner substantially uninfluenced by induced voltages in the connecting line between the first load terminal and the semiconductor chip.

To drive a transistor having a control terminal that is present in addition to the first load terminal, it is possible to use a drive circuit, which receives an input signal, which is referred to the potential at the first load terminal, and which generates a drive voltage based on said input signal, which drive voltage is referred to the potential at the further control terminal. Since the electrical potentials at the further control terminal and at the first load terminal can differ on account of the induced voltages explained above, such drive circuits usually contain a potential barrier, such as, for example, a transformer, which, however, is expensive. There is therefore a need for a cost-effective and reliable drive circuit for a transistor having two control terminals and two load terminals.

One example of such a drive circuit comprises an input, an output, a differential amplifier arrangement and a driver circuit. The output is designed to be connected to a drive input of a transistor component and comprises a first output node and a second output node. The input is designed to receive an input signal, which is referred to a reference potential, and comprises a first input node and a second input node. The differential amplifier arrangement is connected to the first input node, the second input node and the second output node and is designed to generate a drive signal based on the input signal. The driver circuit is designed to receive the drive signal and to generate a drive voltage between the first and second output node based on the drive signal.

Examples are explained below with reference to drawings. The drawings serve to clarify specific principles, with the result that only such aspects as are necessary for the understanding of said principles are illustrated. The drawings are not true to scale. In the drawings, identical reference signs denote identical features.

In the following detailed description, reference is made to the appended drawings. The features of the different examples described below can, of course, be combined with one another, unless explicitly stated otherwise.

Figure 1:
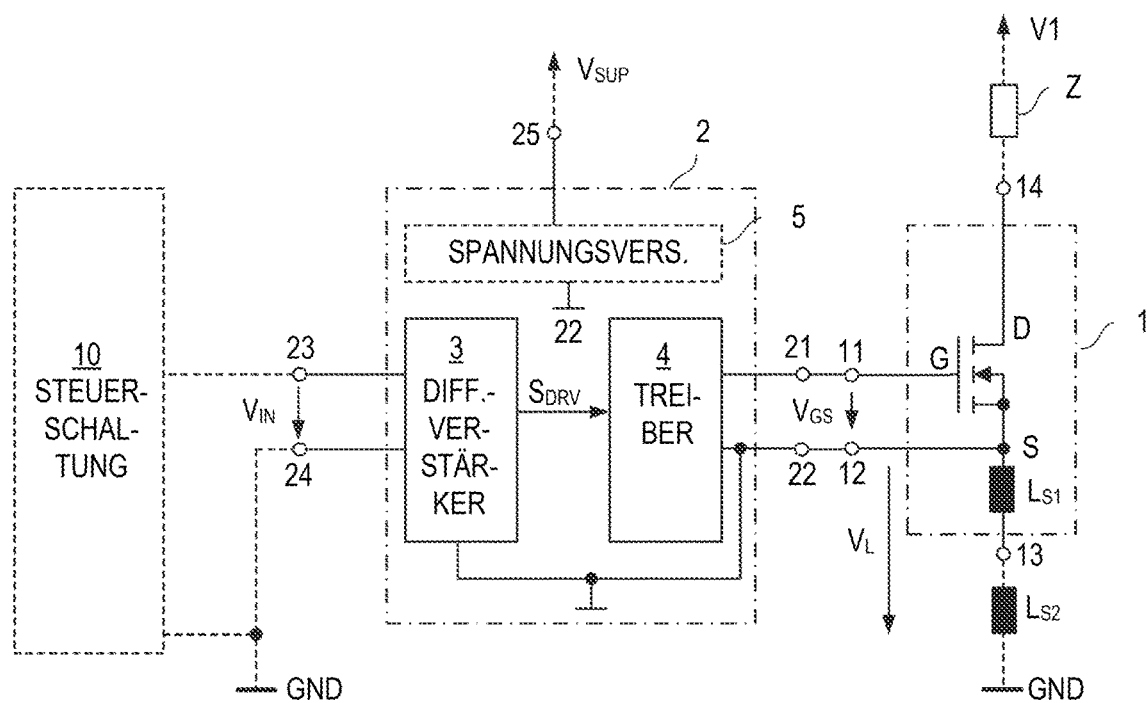
FIG. 1 shows an example of a circuit having a transistor component and a drive circuit, which is designed to drive the transistor component, and which has a differential amplifier arrangement and a driver circuit.

FIG. 1 shows an example of a drive circuit 2, which is designed to drive a transistor component 1. For better understanding of the functioning of the drive circuit 2, FIG. 1 shows, in addition to the drive circuit 2, an example of the transistor component 1 as well. The transistor component 1 comprises a drive input having a first control terminal 11 and a second control terminal 12, a first load terminal 13 and a second load terminal 14. The first load terminal 13 and the second load terminal 14 are present in addition to the first control terminal 11 and the second control terminal 12 of the transistor component 1. The transistor component 1 is designed to receive a drive voltage $V_{GS}$ at the drive input, that is to say between the first control terminal 11 and the second control terminal 12, and turns on or off depending on a voltage level of said drive voltage $V_{GS}$. The transistor component 1 turns on when a voltage level of the drive voltage $V_{GS}$ is above a threshold voltage (which is usually denoted $V_{th}$) and turns off when the voltage level of the drive voltage $V_{GS}$ is below the threshold voltage. When the transistor component 1 turns on, a load current can flow between the first load terminal 13 and the second load terminal 14 of the transistor component when a voltage is applied between the load terminals 13, 14 (which is usually denoted load path voltage). When the component turns off, no load current flows between the load terminals 13, 14 as long as the load path voltage is below the reverse voltage strength of the transistor component 1. Said reverse voltage strength is dependent on the type of transistor component 1 used. In accordance with one example, the transistor component is a power component having a reverse voltage strength of more than 100 V, in particular more than 500 V.

It is assumed that the transistor component 1 is a MOSFET (metal-oxide-semiconductor field-effect transistor), in particular a normally off, n-channel (n-conducting) MOSFET purely for the purposes of explanation. Such a MOSFET turns on when the drive voltage $V_{GS}$ between the first control terminal 11 and the second control terminal is a positive voltage that is above the threshold voltage. The threshold voltage is, for example, in a range between 2 V and 8 V. The MOSFET turns off when the drive voltage $V_{GS}$ is below the threshold voltage, for example at 0 V. Of course, the drive circuit 2 is not restricted to driving a MOSFET as the transistor component 1. The drive circuit 2 is also suitable for driving any other desired transistor component that has a control input having two control terminals that are present in addition to load terminals.

The transistor component 1 comprises a semiconductor chip, in which active component regions, such as, for example, at least one source region, at least one drain region and at least one body region in the case of a MOSFET, are integrated. A MOSFET also has at least one gate electrode arranged in or on the semiconductor chip. Terminals or metallizations directly on said semiconductor chip are subsequently referred to as internal terminals of the transistor component 1. Thus, for example, a transistor component designed as a MOSFET has a source terminal as an internal first load terminal, a drain terminal as an internal second load terminal and a gate terminal as an internal control terminal. The circuit symbol of a MOSFET illustrated in FIG. 1 represents the semiconductor chip, S denotes the first load terminal (source terminal), D denotes the second load terminal (drain terminal) and G denotes the control terminal (gate terminal).

The internal control terminal G, the internal first load terminal S and the internal second load terminal D are connected to the first and second control terminals 11, and the first and second load terminals 13, 14 explained above by means of line connections, which can be realized in different ways. The line connections can contain bonding wires, electrically conductive clips or the like. In the case of the transistor component shown in FIG. 1, the internal control terminal G is connected to the first control terminal 11, the internal first load terminal S is connected to the second control terminal 12 and the first load terminal 13, and the internal second load terminal D is connected to the second load terminal 14.

As is illustrated in FIG. 1 using dashes, the transistor component 1 can serve as an electronic switch, the load path of which is connected in series with a load Z between a terminal for a positive supply potential V1 and a negative supply potential or reference potential GND. The "load path" runs between the first load terminal and the second load terminal 14 of the transistor component.

In particular during switch-on and switch-off of the transistor component 1, extreme changes in a load current flowing via the load path, that is to say between the load terminals 14, 13, can occur. Said changes in current can bring about voltages in parasitic inductances of the feed lines between the internal first load terminal S and the terminal for the reference potential and also between the internal second load terminal D and the load Z. In connection with the drive circuit 2 explained below, in particular, the feed line inductance between the internal first load terminal S and the terminal for the reference potential GND is of interest, which feed line inductance is illustrated explicitly in FIG. 1. Other parasitic inductances are not illustrated, although they are present. The feed line inductance between the internal first load terminal S and the terminal for the reference potential can comprise a first parasitic inductance $L_{S1}$, which is formed by feed lines inside the transistor component 1 between the internal first load terminal S and the first load terminal 13, and comprise a second parasitic inductance $L_{S2}$, which is formed by a feed line between the first load terminal 13 and the terminal for the reference potential GND. Said further feed line inductance $L_{S2}$ can be formed, for example, by conductor tracks on a printed circuit board, on which the transistor component 1 can be arranged.

Figure 2A:
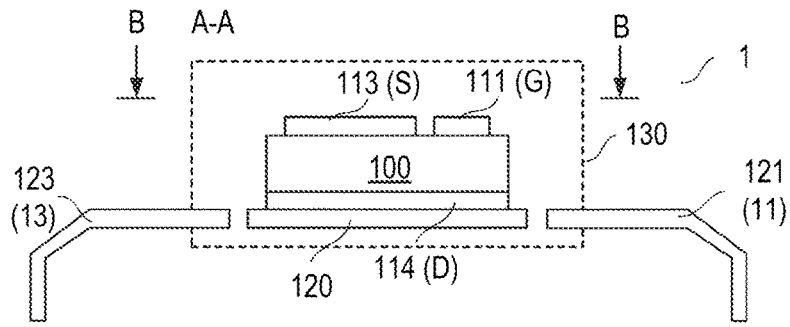
FIGS. 2A and 2B show a cross section and a plan view of a transistor component, which has a housing and a semiconductor chip arranged in the housing.
Figure 2B:
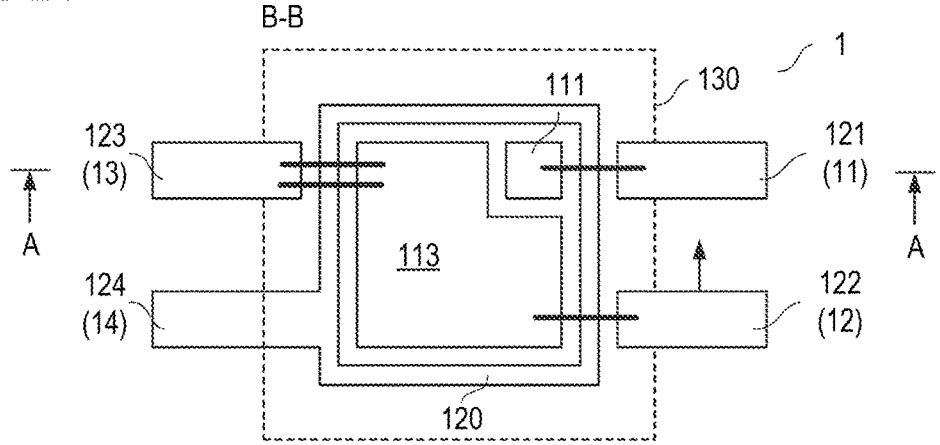

FIGS. 2A and 2B schematically show an example of how the transistor component 1 can be realized. FIG. 2A shows a cross-sectional view of the transistor component 1, which has a housing 130 and a semiconductor chip 100 arranged in the housing 130, and FIG. 2B shows a horizontal sectional view of the transistor component 1. With reference to FIGS. 2A and 2B, the transistor component has on one side of the semiconductor chip 100 an internal control terminal 111, which, in the case of a MOSFET, forms the gate terminal G, and an internal first load terminal 113, which, in the case of a MOSFET, forms the source terminal S. An internal second load terminal 114, which, in the case of a MOSFET, forms the drain terminal D, is arranged on a side of the semiconductor chip 100 that is opposite the side having the internal control terminal 111 and the internal first load terminal 113. Said internal terminals 111, 113, 114 can be realized, for example, by metallizations on the semiconductor chip 100, wherein said metallizations are electrically conductively connected to corresponding active component regions (such as, for example, source region and drain region in the case of a MOSFET) in the semiconductor chip 100. The fact that the first and second internal load terminals 113, 114 are arranged on opposite sides of the semiconductor chip 100 is merely one example. In other examples, said load terminals can also be arranged on the same side of the semiconductor chip.

With reference to FIGS. 2A and 2B, the semiconductor chip 100 is arranged in a housing 130, from which terminal pins 121-124 project, wherein said terminal pins 121-124 form the first and second control terminals 11, 12 and the first and second load terminals 13, 14 explained above. A first terminal pin 121 is electrically conductively connected inside the housing 130 to the internal control terminal 111 and forms the first control terminal 11 of the transistor component 1. A second terminal pin 122 is connected inside the housing 130 to the internal first load terminal 113 and forms the second control terminal 12 of the transistor component. A third terminal pin 123 is electrically conductively connected inside the housing 130 to the internal first load terminal 113 and forms the first load terminal 13 of the transistor component. And a fourth terminal pin 124 is electrically conductively connected to the internal second load terminal 114 and forms the second load terminal 14 of the transistor component 1. Electrically conductive connections between the first, second and third terminal pin 121, 122, 123 and the respective internal terminals 111, 112, 113 comprise, for example, bonding wires, which are illustrated in FIG. 2 by thick lines. The use of bonding wires is merely one example. As an alternative or in addition, flat conductors (terminal clips) can be used. In the example illustrated, the fourth terminal pin 124 is part of a flat conductor (which is usually referred to as a leadframe), to which the internal second load terminal 114 is electrically conductively connected. The electrically conductive connection can comprise, for example, a soldering connection, an electrically conductive adhesive connection or the like.

The connections between the internal terminals 111, 112, 113 and the terminal pins 121, 122, 123, 124 that are accessible from outside the housing 130, but also the terminal pins 121, 122, 123, 124, form parasitic inductances, from which the inductance formed between the internal first load terminal 113 and the associated terminal pin contribute to the feed line inductance $L_{S1}$ illustrated in figure. Corresponding inductances are also present between the other internal terminals and the (outer) terminals 11, 12 and 14 or terminal pins 121, 122, 124. However, these inductances are not illustrated in FIG. 1.

The voltage induced in the feed line inductance $L_{S1}$, $L_{S2}$ during switching of the transistor component 1 and denoted in FIG. 1 by $V_L$ can result in significant potential differences between the reference potential GND and the electrical potential at the second control terminal 12. In connection with parasitic capacitances of the transistor component 1 (which are not illustrated in the figures), in particular, oscillations with amplitudes of 100 V or more can arise, that is to say the voltage $V_L$ can be an oscillating voltage with an amplitude of 100 V or more. In accordance with one example, the drive circuit 2 is designed to receive as input signal $V_{IN}$ a voltage, which is referred to the reference potential GND, and to generate the drive voltage $V_{GS}$ based on said input signal $V_{IN}$, said drive voltage being referred to the potential at the second control terminal 12. Said input voltage can be generated by a central control circuit 10, such as a microcontroller, for example.

On account of the explained feed line inductance $L_{S1}$, $L_{S2}$, the reference potentials for the input signal $V_{IN}$ and the drive voltage $V_{GS}$ can deviate significantly from one another particularly during switch-on and switch-off of the transistor component 1. Conventional drive circuits contain a potential barrier, such as, for example, a transformer, between the input and the output, in order to avoid problems that can arise owing to said potential difference. A potential barrier of this kind is not necessary in the drive circuit 2 in accordance with FIG. 1, as a result of which said drive circuit can be realized in a more cost-effective manner in comparison with a conventional drive circuit.

As is illustrated in FIG. 1, the drive circuit 2 comprises an output 21, 22, which is designed to be connected to the drive input 11, 12 of the transistor component 1 and to provide the drive voltage $V_{GS}$, and an input for receiving the input signal $V_{IN}$. The output 21, 22 comprises a first output node 21, which is designed to be connected to the first control terminal 11 of the transistor component 1, and a second output node 22, which is designed to be connected to the second control terminal 12 of the transistor component 1. The input 23, 24 comprises a first input node 23 and a second input node 24. In accordance with one example, the second input node 24 is connected during operation of the drive circuit 2 to the terminal for the reference potential GND to which the first load terminal 13 of the transistor component 1 is also connected.

The drive circuit 2 also comprises a differential amplifier arrangement 3, which is connected to the first input node 23, the second input node 24 and the second output node 22. The differential amplifier arrangement 3 is designed to generate a drive signal $S_{DRV}$ based on the input signal $V_{IN}$ received at the input 23, 24. A driver circuit 4 receives said drive signal $S_{DRV}$ and is designed to generate the drive voltage $V_{GS}$ at the output 21, 22 based on said drive signal $S_{DRV}$.

Figure 3:
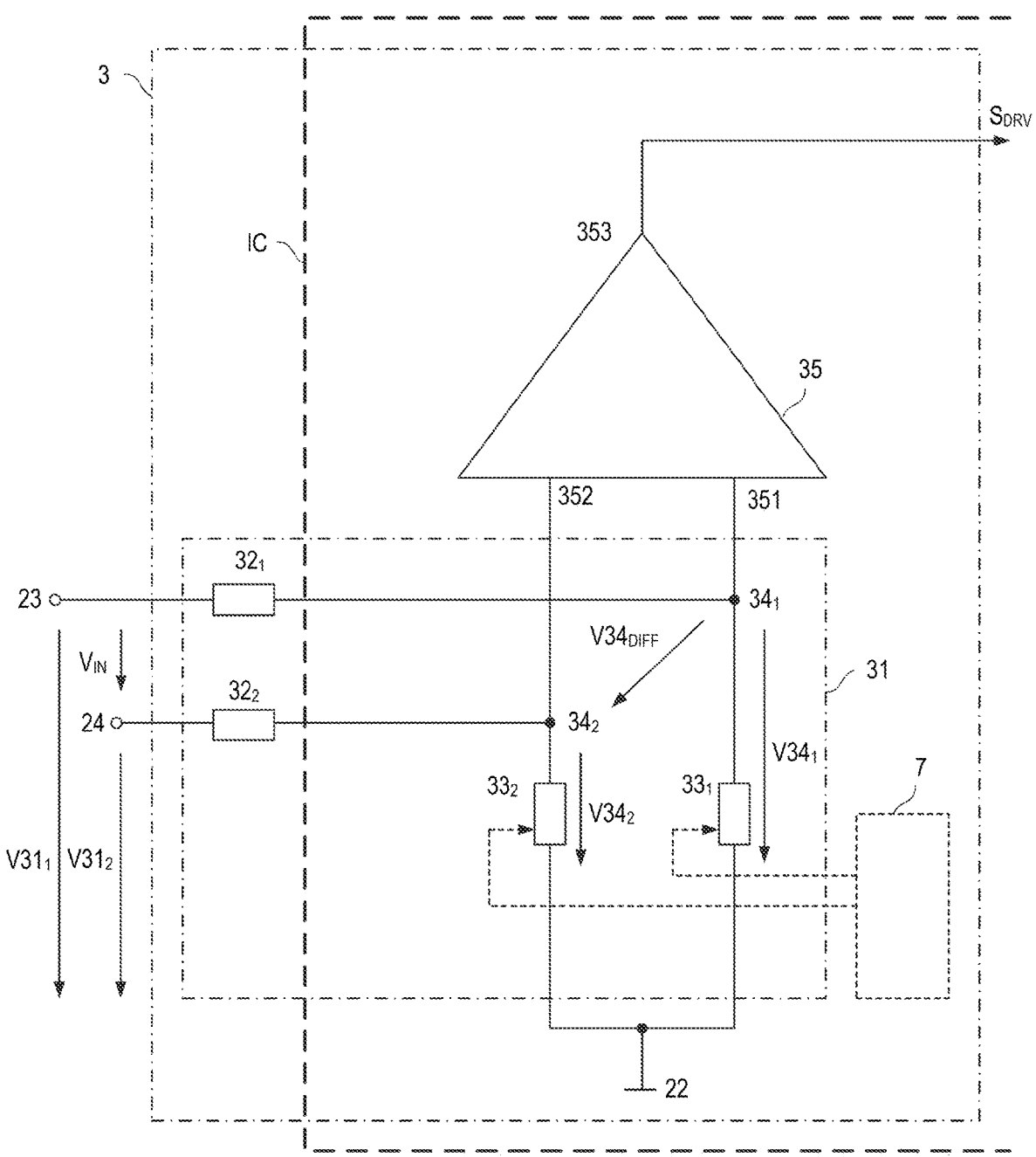
FIG. 3 shows an example of a differential amplifier arrangement, which has an input stage and a differential amplifier.

FIG. 3 shows an example of the differential amplifier arrangement 3 in detail. Said differential amplifier arrangement 3 comprises an input stage and a differential amplifier 35. The input stage 31 is connected to the first input node 23, the second input node 24 and the second output node 22. The differential amplifier 35 comprises an input 351, 352, which is connected to the input stage 31, and an output 353. The differential amplifier 35 is designed to output the drive signal $S_{DRV}$ at the output 353 thereof. In accordance with one example, the drive signal $S_{DRV}$ is a voltage, which is referred to the electrical potential at the second output node 22.

In the example shown in FIG. 3, the input stage 31 comprises a first voltage divider, which is connected between the first input node 23 and the second output node 22 and which has a tap $34_1$. Said tap $34_1$ of the first voltage divider is connected to a first input node 351 of the input 351, 352 of the differential amplifier 35.

The input stage 31 also comprises a second voltage divider, which is connected between the second input node 24 and the second output node 22 and which has a tap $34_2$. The tap $34_2$ of the second voltage divider is connected to a second input node 352 of the input 351, 352 of the differential amplifier 35. The first voltage divider and the second voltage divider comprise a respective first resistor $32_1$, $32_2$. The first resistor $32_1$ of the first voltage divider is connected between the second input node 23 and the tap $34_1$ of the first voltage divider, and the first resistor $32_2$ of the second voltage divider is connected between the second input node 24 and the tap $34_2$ of the second voltage divider. The first voltage divider and the second voltage divider also comprise a respective second resistor $33_1$, $33_2$. The second resistor $33_1$ of the first voltage divider is connected between the tap $34_1$ of the first voltage divider and the second output node 22, and the second resistor $33_2$ of the second voltage divider is connected between the tap $34_2$ of the voltage divider and the second output node 22.

The differential amplifier 35 receives as input signal voltages $V34_1$, $V34_2$, which are each applied between the taps $34_1$, $34_2$ of the voltage dividers and the second output terminal 22. The differential amplifier 35 is designed to generate the drive signal $S_{DRV}$ depending on a difference $V34_{DIFF}$ of the input voltages $V34_1$, $V34_2$. In accordance with one example, the differential amplifier 35 is designed to generate the drive signal $S_{DRV}$ so that it has a first signal level when the voltage difference $V34_{DIFF}$ is above a prescribed first voltage threshold and has a second signal level when the voltage difference $V34_{DIFF}$ is below a prescribed second voltage threshold. The first and second voltage threshold can be identical, but can also be different, in order to maintain hysteresis during switchover between the two signal levels. The first signal level causes, for example, switch-on of the transistor component through the driver circuit 4 (cf. FIG. 1) and the second signal level causes, for example, switch-off of the transistor component through the driver circuit 4. In accordance with one example, the voltage dividers and the input signal $V_{IN}$ are coordinated with one another so that the voltage difference $V34_{DIFF}$ is above the first voltage threshold when the input signal $V_{IN}$ has a first signal level indicating that the transistor component 1 should be switched on and that the voltage difference $V34_{DIFF}$ is below the second voltage threshold when the input signal $V_{IN}$ has a second signal level indicating that the transistor component 1 should be switched off. The first signal level of the input signal $V_{IN}$ is, for example, 3.3 V or 5 V and the second signal level is, for example, 0 (zero) V. Said first signal level of the input signal $V_{IN}$ is subsequently also referred to as on level and the second signal level is subsequently also referred to as off level. Examples of how the differential amplifier can be realized are explained further below.

The input voltages $V34_1$, $V34_2$ of the differential amplifier 35 are proportional to voltages $V31_1$, $V31_2$ that are applied across the voltage dividers, that is to say that are applied between the first input node 23 and the first output node 22 and between the second input node 24 and the output node. For said input voltages $V34_1$, $V34_2$, the following holds true:

$$V34_1 = \frac{R33_1}{R33_1 + R32_1} \cdot V31_1 \quad (1a)$$

$$V34_2 = \frac{R33_2}{R33_2 + R32_2} \cdot V31_2 \quad (1b)$$

wherein $R32_1$ is the resistance value of the first resistor $32_1$ of the first voltage divider, $R32_2$ is the resistance value of the first resistor $32_2$ of the second voltage divider, $R33_1$ is the resistance value of the second resistor $33_1$ of the first voltage divider and $R33_2$ is the resistance value of the second resistor $33_2$ of the second voltage divider. In accordance with one example, the resistance values $R32_1$, $R32_2$ of the first resistors $32_1$, $32_2$ are each equal ($R32_1=R32_2$) and the resistance values $R33_1$, $R33_2$ of the second resistors $33_1$, $33_2$ are each equal ($R33_1=R33_2$). In this case, the input voltages $V34_1$, $V34_2$ are proportional to the voltages $V31_1$, $V31_2$ in the same manner, that is to say a proportionality factor between the first input voltage $V34_1$ and the voltage $V31_1$ across the first voltage divider is equal to a proportionality factor between the second input voltage $V34_2$ and the voltage $V31_2$ across the second voltage divider. The following thus holds true:

$$V34_1 = c1 \cdot V31_1 \quad (2a)$$

$$V34_2 = c1 \cdot V31_2 \quad (2b)$$

wherein c1 denotes the proportionality factor between the input voltages $V34_1$, $V34_2$ of the differential amplifier 36 and the respective voltages $V31_1$, $V31_2$ applied across the voltage dividers. The voltages $V31_1$, $V31_2$ across the first and second voltage divider are dependent on the input voltage $V_{IN}$ and the voltage $V_L$ (compare FIG. 1) across the feed line inductance $L_{S1}$, $L_{S2}$ as follows:

$$V31_1 = V_{IN} + V_L \quad (3a)$$

$$V31_2 = +V_L \quad (3b)$$

As can be seen on the basis of equations (3a) and (3b), the voltage $V_L$ across the feed line inductance acts as common-mode interference, which has the same effect on the voltages $V31_1$, $V31_2$ across the voltage dividers and hence the same effect (compare equations (2a) and (2b)) on the input voltages $V34_1$, $V34_2$. By virtue of the differential amplifier 35 generating the drive signal $S_{DRV}$ depending on the difference $V34_{DIFF}$ of the input voltages $V34_1$, $V34_2$ thereof, the common-mode interference resulting from said voltage $V_L$ across the feed line inductance $L_{S1}$, $L_{S2}$ is suppressed so that it does not influence the generation of the drive signal $S_{DRV}$.

In accordance with one example, the resistance values $R31_1$, $R31_2$, $R33_1$, $R33_2$ of the aforementioned resistors $31_1$, $31_2$, $33_1$, $33_2$ of the first and second voltage divider and the input resistors $365_1$, $365_2$ of the differential amplifier 36 are selected so that the proportionality factor c1 between the input voltages $V34_1$, $V34_2$ of the differential amplifier 35 and the voltages $V31_1$, $V31_2$ across the voltage dividers is between $\frac{1}{100}$ ($10^{-2}$) and $\frac{1}{10}$ ($10^{-1}$), in particular between $\frac{1}{60}$ and $\frac{1}{20}$. In accordance with one example, the resistance values $R31_1$, $R31_2$ of the first resistors $31_1$, $31_2$ are each 33 kΩ and the resistance values $R33_1$, $R33_2$ are each 1 kΩ, that is to say 33 times the resistance values $R31_1$, $R31_2$ of first resistors $31_1$, $31_2$. The proportionality factor c1 is in this case $\frac{1}{34}$.

In accordance with one example, the drive circuit 2 is at least partly arranged in an integrated circuit IC. In this case, the first resistors $32_1$, $32_2$ of the two voltage dividers can be realized outside of the integrated circuit IC, that is to say as discrete external resistors, whereas the other resistors explained above can be integrated in the integrated circuit IC. This is illustrated schematically in FIG. 3 by the dashed line denoted by the reference sign IC, which dashed line illustrates the boundaries of the integrated circuit IC.

In accordance with one example, the second resistors $33_1$, $33_2$ of the two voltage dividers are settable (trimmable) resistors in order to be able to coordinate the resistance values $R33_1$, $R33_2$ of said two resistors as exactly as possible with one another and, in particular, with the resistance values of the first resistors $31_1$, $31_2$. As mentioned, the first resistors $31_1$, $31_2$ can be discrete resistors. Such discrete resistors can be produced so precisely that the actual resistance value deviates from a setpoint value by less than 1% or even only less than 0.1%. In contrast, resistance values of integrated resistors, such as, for example, of the second resistance values, are subjected to greater production-related fluctuations. The resistance values of such integrated resistors, which are polysilicon resistors, for example, can deviate in a production-related manner from a desired setpoint value by up to 20%. By setting the resistance values $R33_1$, $R33_2$ of the second resistors, it is possible to set, in particular, the voltage divider ratio of the two voltage dividers, that is to say the proportionality factor c1 explained on the basis of equations (2a) and (2b). Said two second resistors $33_1$, $33_2$ are set, for example, using a test circuit 7, which is illustrated in FIG. 3 using dashes and which can be integrated in the integrated circuit IC. Said test circuit 7 is designed, after the production process has finished, to measure the resistance values $R33_1$, $R33_2$ of the second resistors $33_1$, $33_2$ and to adjust the resistance values when they deviate from a prescribed setpoint value.

Figure 4:
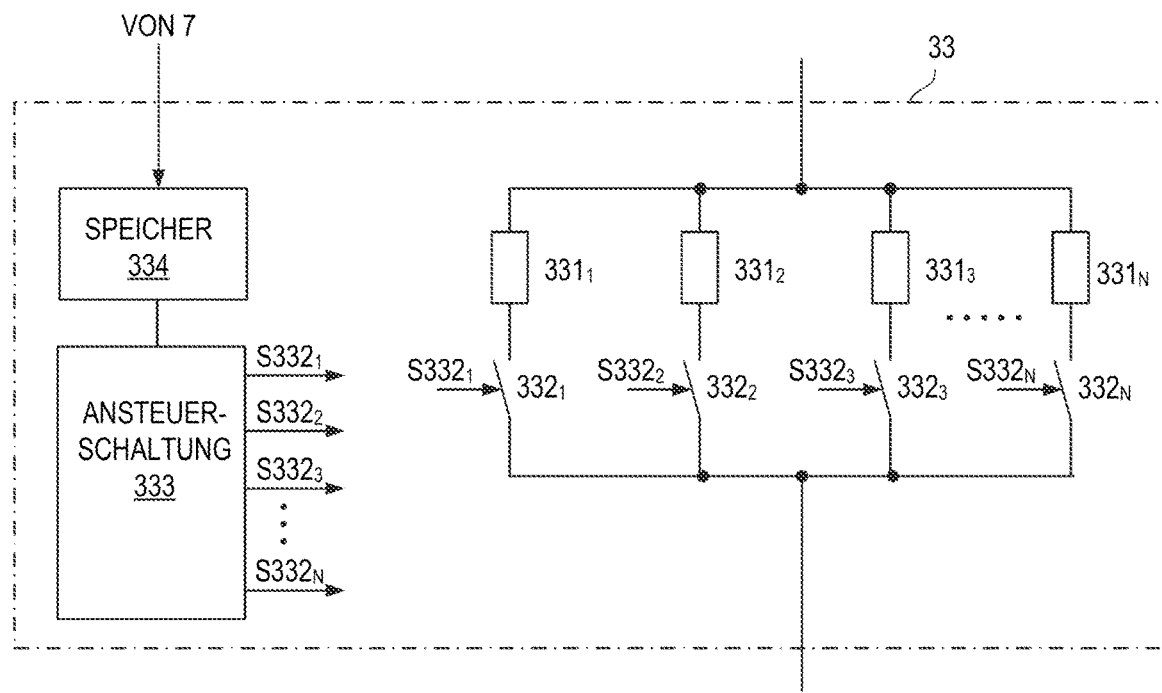
FIG. 4 shows an example of an electrical resistor, which can be used in the input stage in accordance with FIG. 3 and which has a resistor arrangement having a plurality of deactivatable resistor elements.

In accordance with one example, each of the second resistors $33_1$, $33_2$ comprises a resistor arrangement having a plurality of deactivatable resistor elements. One example of such a resistor arrangement is shown in FIG. 4, wherein the reference sign 33 in FIG. 4 represents any desired one of the two resistors $33_1$, $33_2$. In the example shown in FIG. 4, the resistor arrangement comprises a plurality of resistor elements $331_N$ connected in parallel, wherein an electronic switch $332_1$-$332_N$ is connected in series with at least some of said resistor elements $331_1$-$331_N$. The switches $332_1$-$332_N$ serve to activate (when the switch is closed) or to deactivate (when the switch is open) the respective resistor element $331_1$-$331_N$ connected in series therewith. The total resistance value of said resistor arrangement is given by the resistance value of the parallel circuit of the activated resistor elements. The electronic switches $332_1$-$332_N$ can be any desired electronic switches, such as transistors, for example. The provision of a $332_1$-$332_N$ in series with each of the resistor elements $331_1$-$331_N$ is just one example. In accordance with a further example, at least one of the resistor elements $331_1$-$331_N$ is not deactivatable, that is to say does not have a switch connected in series therewith.

The switches $332_1$-$332_N$ are driven by a drive circuit 333. The drive circuit 333 is connected to a memory 334 and receives from the memory 334 the information about which of the resistor elements $331_1$-$331_N$ should be activated and which should be deactivated, that is to say which of the switches $332_1$-$332_N$ should be switched on and which should be switched off. The memory 334 can be any desired memory, in particular any desired once-only writeable memory, such as, for example, an array having a plurality of fuses. In one example, there is provision for each resistor element to be assigned such a fuse, wherein the state of the fuse—intact or blown—indicates whether the assigned resistor element should be activated or deactivated.

The programming of the memory 334, for example by tripping individual fuses (when the memory contains fuses), can be effected by the test circuit 7 or by an external circuit, which is capable of programming the memory and is connected to the differential amplifier arrangement 3 for setting the resistance values. Said circuit receives the measurement result from the test circuit 7, for example, and programs the memory (334 in FIG. 4) of the respective resistor arrangement taking said measurement result into account, in order to set the resistance value as a result. An interface between the test circuit 7 and said external circuit can be any desired interface, which is not illustrated in the figures, however. In accordance with a further example, the test circuit 7 is also an external circuit and is connected to the integrated circuit only at the end of the production process by means of a suitable interface, in order to measure the the resistance values of the second resistors $33_1$, $33_2$ and to program the memory (334 in FIG. 4).

In accordance with one example, the differential amplifier 35 comprises an operational amplifier having a very high input resistance, and a thus negligible input current, which operational amplifier receives the voltage difference $V34_{DIFF}$ and the drive signal $S_{DRV}$ depending on the voltage difference $V34_{DIFF}$.

Figure 5:
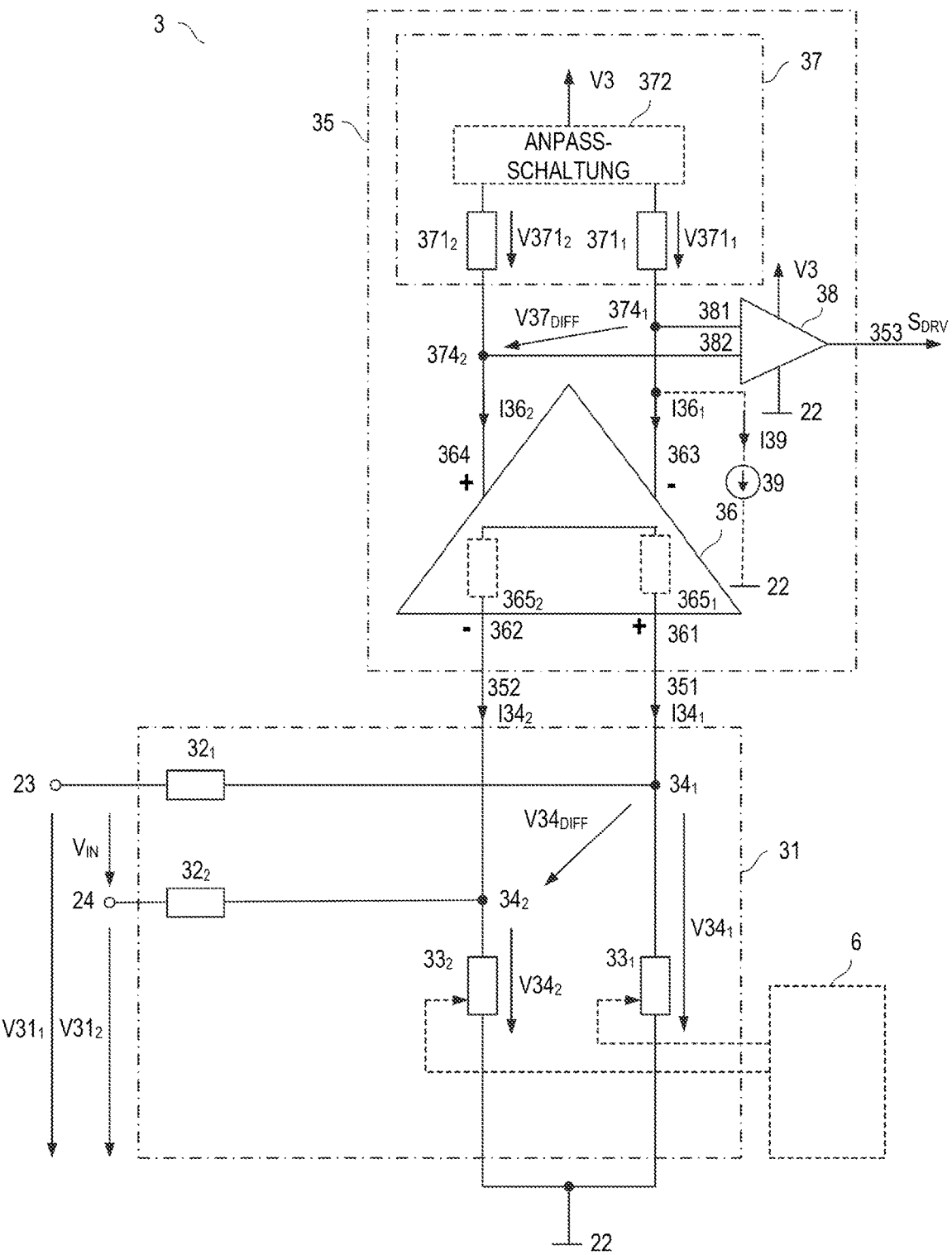
FIG. 5 shows an example of a differential amplifier, which has a differential input stage and a differential output stage.

A further example of the differential amplifier 35 is illustrated in FIG. 5. Said differential amplifier comprises a differential input stage 36, a current-voltage converter 37 and a differential output stage 38. The differential input stage 36 comprises a first input 361, which is connected to the first input 531 of the differential amplifier 35, and hence to the tap $34_1$ of the first voltage divider, and a second input 362, which is connected to the second input 352 of the differential amplifier 35, and hence to the tap $34_2$ of the second voltage divider. The differential input stage 36 also comprises a first output 363, which is connected to a terminal for a supply potential V3 by means of the current-voltage converter 37, and a second output 364, which is connected to the terminal for the supply potential V3 by means of the current-voltage converter 37. The supply potential V3 is referred to the electrical potential at the second output node 22 and is, for example, 3.3 V or 5 V. The current-voltage converter 37 comprises a first resistor $371_1$, which connects the first output 363 of the input stage 36 to the supply potential V3, and a second resistor $371_2$, which connects the second output 364 of the input stage 36 to the supply potential V3. In accordance with one example, resistance values of said two resistors $371_1$, $371_2$ are of substantially the same magnitude. A matching circuit 372 is optionally connected between the two resistors $371_1$, $371_2$ and the supply potential V3. One example for the realization of said matching circuit 372 and the functioning thereof are explained further below.

The differential output stage 38 comprises a first input 381, a second input 382 and an output 383. The output 383 is connected to the output 353 of the differential amplifier 35 and provides the drive signal $S_{DRV}$. The output stage 38 is realized, for example, as a Schmitt trigger and is designed to generate the drive signal $S_{DRV}$ depending on a voltage $V37_{DIFF}$ applied between the first input 381 and the second input 382. Said voltage $V37_{DIFF}$ is dependent on output currents $I36_1$, $I36_2$ of the input stage 36 and is generated by the current-voltage converter 37 depending on said output currents $I36_1$, $I36_2$. In the example illustrated in FIG. 5, the output stage 38 is connected at circuit nodes (taps) $374_1$, $374_2$ between the outputs 363, 364 of the differential input stage 36 and the current-voltage converter 37. In particular, the first input 361 of the output stage 38 is connected to a circuit node $374_1$ between the first output 363 of the input stage 36 and the first resistor $371_1$, and the second input 382 is connected to a circuit node $374_2$ between the second output 364 of the input stage 36 and the second resistor $371_2$. In the example illustrated, the inputs of the output stage 381, 382 are therefore directly connected to the outputs 363, 364 of the input stage 36. However, this is only one example. In accordance with a further example (not illustrated), the current-voltage converter 37 comprises a current mirror having input branches that are connected to the outputs 363, 364 of the input stage 36 and in which the output currents $I36_1$, $I36_2$ of the input stage 36 flow, and output branches through which flow currents that are proportional to the output currents $I36_1$, $I36_2$ of the input stage 36 and to which the output stage 38 is connected.

The output currents $I36_1$, $I36_2$ of the input stage 36 are currents that flow at the outputs 363, 364 of the input stage 36. In the example shown in FIG. 5, said currents $I36_1$, $I36_2$ flow at the outputs 363, 364 into the input stage 36, which is just one example, however. "Input currents" $I34_1$, $I34_2$ of the input stage 36 are currents that flow at the inputs 361, 362 of the input stage 36. In the example shown in FIG. 5, said currents flow out of the input stage 36 into the taps $34_1$, $34_2$ of the voltage dividers, which is likewise just one example, however. In accordance with one example, the input stage 36 is realized so that a first input current $I34_1$ corresponds substantially to the first output current $I36_1$ and a second input current $I34_2$ corresponds substantially to the second output current $I36_2$. The functioning of the differential amplifier 35 illustrated in FIG. 5 is explained below.

The differential input stage 36 is designed to generate the input currents $I34_1$, $I34_2$ and hence the output currents $I36_1$, $I36_2$ depending on the voltage $V34_{DIFF}$ applied between the inputs 361, 362. The input currents $I34_1$, $I34_2$ are equal ($I34_1$=$I34_2$) when the voltage $V34_{DIFF}$ is zero, which is the case when the input signal $V_{IN}$ has the off level (0 V). The output currents $I36_1$, $I36_2$ are in this case likewise equal ($I36_1$=$I36_2$), which leads to voltages $V371_1$, $V371_2$ across the first and second resistor $371_1$, $371_2$ of the current-voltage converter being equal, as a result of which the voltage $V37_{DIFF}$ applied at the input of the output stage 38 is likewise zero. If the voltage $V34_{DIFF}$ applied at the input of the input stage 36 is greater than zero, the second input current $I34_2$ increases compared to the first input current $I34_1$ and the second output current $I36_2$ increases compared to the first output current $I36_1$. Therefore, the voltage drop $V371_2$ at the second resistor $371_2$ increases compared to the voltage drop $V371_1$ at the first resistor $371_1$, which leads to the voltage $V37_{DIFF}$ applied at the input 381, 382 of the output stage 38 being greater than zero. The output stage 38 is in this example designed to generate the first signal level (on level) of the drive signal $S_{DRV}$ when the voltage difference $V37_{DIFF}$ is greater than zero and to generate the second signal level (off level) of the drive signal $S_{DRV}$ when the voltage difference $V37_{DIFF}$ is zero.

A current source 39 is optionally connected to the circuit node between the first output 363 of the differential input stage and the current-voltage converter 37. Said current source 39 is interconnected so that it causes a current $I39$ through the first resistor $371_1$ in addition to the first output current $I36_1$. Therefore, when the output currents $I36_1$, $I36_2$ are the same, the voltage drop $V371_1$ across the first resistor $371_1$ is greater than the voltage drop $V371_2$ across the second resistor $371_2$. Therefore, when the output currents $I36_1$, $I36_2$ are the same, the voltage $V37_{DIFF}$ is negative. In accordance with one example, the differential input stage 36 generates the output currents $I36_1$, $I36_2$ so that a difference between said output currents $I36_2$-$I36_1$ when the input signal $V_{IN}$ has the on level is double the current $I39$ delivered by the current source 39. In this case, the voltage $V37_{DIFF}$ at the input of the output stage 38 in the case of the on level of the input voltage $V_{IN}$ and in the case of the off level of the input voltage $V_{IN}$ is symmetrical to zero.

As a result of the fact that, in the case of the differential amplifier illustrated in FIG. 5, in addition to the input stage 36, the output stage 38 is also a differential stage, a high degree of robustness of the circuit with respect to common-mode interference signals is achieved. The input currents $I34_1$, $I34_2$ of the input stage 36 contribute in this circuit, in addition to the input voltage $V_{IN}$ and the common-mode interference signal $V_L$, to the voltages $V34_1$, $V34_2$ between the taps $34_1$, $34_2$ and the second output node 22. The components of the voltages $V34_1$, $V34_2$ caused by said currents $I34_1$, $I34_2$ are the same, however, when the input voltage $V_{IN}$ is zero, that is to say when the input voltage has the second signal level (off level). The currents $I34_1$, $I34_2$ therefore influence the voltage difference $V34_{DIFF}$ at the input of the input stage, and hence do not influence the voltage difference $V37_{DIFF}$ at the input of the output stage 38, so that the output stage generates the second signal level (off level) of the drive signal $S_{DRV}$. If the input voltage $V_{IN}$ has the first signal level (on level), such as, for example, 3.3 V or 5 V, the input currents $I34_1$, $I34_2$, which are then no longer equal, cause the voltage difference $V34_{DIFF}$ to become smaller. However, the circuit is coordinated so that, despite said currents $I34_1$, $I34_2$, the voltage difference $V34_{DIFF}$ is greater than zero, so that the voltage $V37_{DIFF}$ applied at the input of the output stage is also greater than zero. As a result, the output stage generates a first signal level (on level) of the drive signal $S_{DRV}$.

Figure 6:
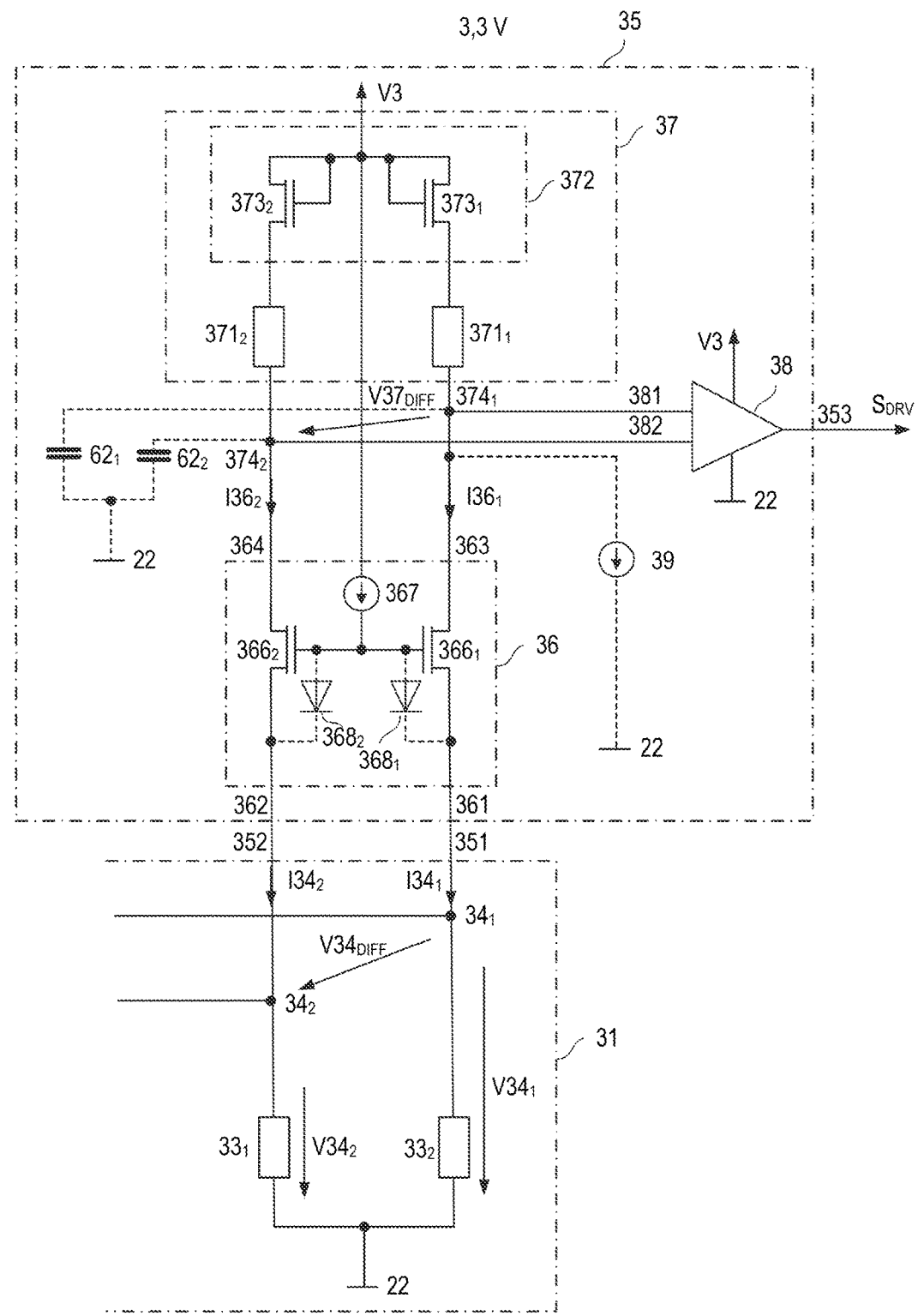
FIG. 6 shows an example of the differential input stage of the differential amplifier.

FIG. 6 shows an exemplary realization of the differential input stage 36. In this example, the input stage 36 comprises two transistors, a first transistor $366_1$ and a second transistor, which are realized, for example, as NMOS transistors. Gate terminals of said two transistors $366_1$, $366_2$ are connected to one another. A source terminal of the first transistor $366_1$ is connected to the first input 361 of the input stage 36 and a source terminal of the second transistor $366_2$ is connected to the second input 362 of the input stage 36. A current source 367, which is connected between the supply potential V3 and the gate terminals of the two transistors $366_1$, $366_2$, serves to set the operating points. The voltage difference $V34_{DIFF}$ at the input of the input stage is the voltage between the source terminals of the two transistors $366_1$, $366_2$, wherein the source potential (the potential at the source terminal) of the second transistor $366_2$ decreases compared to the source potential of the first transistor $366_1$ when the voltage difference $V34_{DIFF}$ becomes greater than zero. As a result, the gate-source voltage of the second transistor $366_2$ increases compared to the gate-source voltage of the first transistor $366_1$, as a result of which the current through the second transistor $366_2$ increases compared to the current through the first transistor $366_1$. The current through the second transistor $366_2$ is in this example the input current $I34_2$ and also the output current $I36_2$. Optionally, a diode $368_1$ is connected between the gate terminal and the source terminal of the first transistor $366_1$ and a second diode $368_2$ is connected between the gate terminal and the source terminal of the second transistor $366_2$. Said two diodes $368_1$, $368_2$ can each be realized as NMOS transistors, the gate terminal and the drain terminal of which are connected to one another.

In the differential amplifier 35 illustrated in FIG. 6, the properties of the two transistors $366_1$, $366_2$ of the differential input stage 36, in particular the gradient of said transistors $366_1$, $366_2$ at the operating point set by the current source, can influence a ratio $V37_{DIFF}/V34_{DIFF}$ between the differential input voltage $V37_{DIFF}$ of the output stage 38 and the differential input voltage $V34_{DIFF}$ of the input stage 32. The gradient of the transistors $366_1$, $366_2$ at the set operating point is determined by the ratio between a change in the current flowing through the respective transistor $366_1$, $366_2$ and a change in the gate-source voltage, which causes said change. Through suitable selection of the transistors $373_1$, $373_2$ of the matching circuit 372, it is possible to achieve a situation in which said ratio $V37_{DIFF}/V34_{DIFF}$ is only determined by the resistance values $R33_1$, $R33_2$ of the second resistors $33_1$, $33_2$ and resistance values $R371_1$, $R371_2$ of the resistors $371_1$, $371_2$ of the current-voltage converter 37.

In accordance with one example, there is provision for the resistance values $R33_1$, $R33_2$ of the second resistors $33_1$, $33_2$ to each be equal so that $R33_1=R33_2=R33$ holds true and for the resistance values $R373_1$, $R373_2$ of the resistors $371_1$, $371_2$ of the current-voltage converter 37 to each be equal so that $R371_1=R371_2=R371$ holds true. In this example, there is furthermore provision for the transistors $366_1$, $366_2$ to be dimensioned in an identical manner and to each have a gradient $gm_{366}$ and for the transistors $373_1$, $373_2$ of the matching circuit 372 to be dimensioned in an identical manner and to have a gradient $gm_{373}$. Furthermore, in this example, the transistors $366_1$, $366_2$ of the input stage 36 and the transistors $373_1$, $373_2$ of the matching circuit are selected so that the gradients $gm_{366}$, $gm_{373}$ thereof, are matched to the resistance values R33, R373 so that the following holds true:

$$R33 \cdot gm_{366} = R371 \cdot gm_{371} \tag{4a}$$

In this case, the ratio $V37_{DIFF}/V34_{DIFF}$ of the input voltages $V37_{DIFF}$ and $V34_{DIFF}$ is determined only through the resistance values R33, R371 of the second resistors $33_1$, $33_2$ and the resistors $371_1$, $371_2$ of the current-voltage converter 37. The following holds true:

$$\frac{V37_{DIFF}}{V34_{DIFF}} = \frac{R371}{R33}. \quad (5)$$

If the differential input stage 36 also comprises two transistors respectively interconnected as diodes 368$_1$, 368$_2$, which each have a gradient gm$_{368}$ at the set operating point, equation (5) is then satisfied when the individual transistors are selected so that the following holds true:

$$R33 \cdot (gm_{366} + gm_{368}) = R371 \cdot gm_{371} \quad (4b).$$

Figure 7:
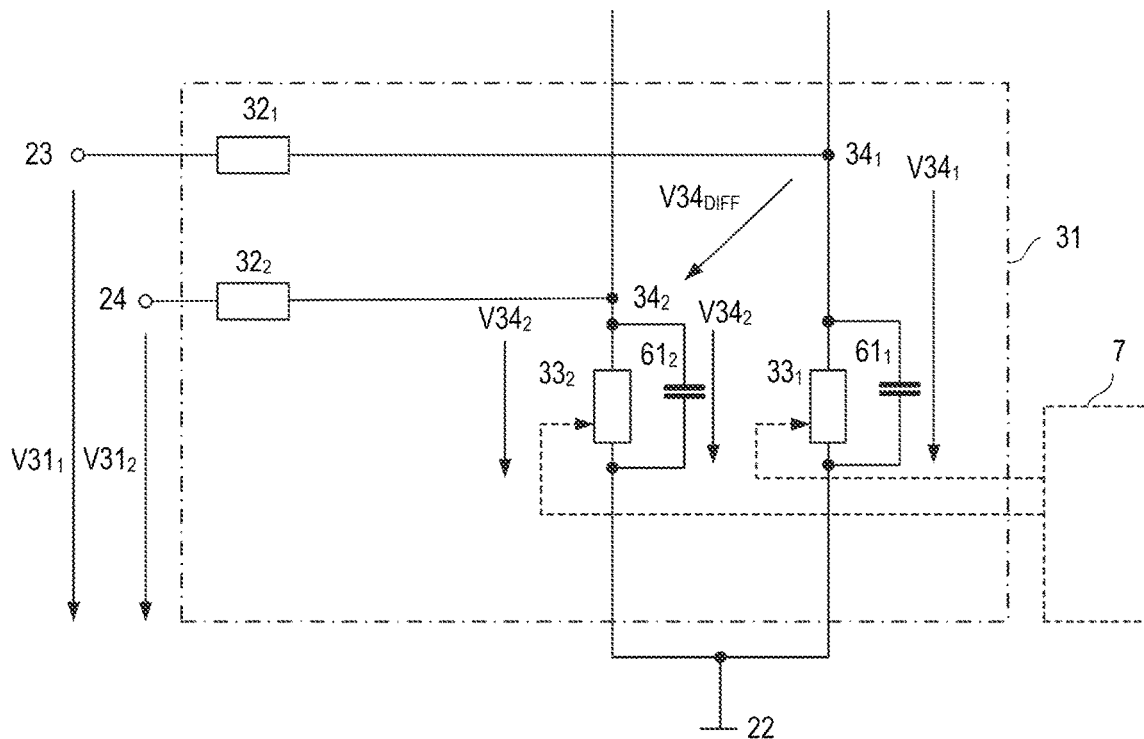
FIG. 7 shows a modification of the input stage in accordance with FIG. 3.

FIG. 7 shows a further example of the input stage 31 of the differential amplifier arrangement 3. In this example, a first capacitor 61$_1$ is connected between the tap 34$_1$ of the first voltage divider and the second output node 22 and a second capacitor 61$_2$ is connected between the tap 34$_2$ of the second voltage divider and the second output node 22. Each of said capacitors 61$_1$, 61$_2$ forms, together with the first resistor 32$_1$, 32$_2$ of the respective voltage divider, a low-pass filter, which attenuates common-mode signals whose frequency is above the cutoff frequency of the low-pass filter. The cutoff frequency of said two low-pass filters of the first order is, for example, 15 MHz. In this case, high-frequency voltages V$_L$, which can arise at the feed line inductances L$_{S1}$, L$_{S2}$ during switching of the transistor component 1, are attenuated. Interference signals corresponding to a frequency 10 times the cutoff frequency are reduced in terms of their amplitude, for example, by the factor 10 (20 dB). In the input stage 31 in accordance with FIG. 7, in the case of high-frequency common-mode interference signals, it is thus not only the divider ratio of the resistive voltage dividers that determines the ratio between the amplitude of the common-mode interference signal and the amplitudes of the voltages V34$_1$, V34$_2$ but also the low-pass filters additionally cause, in the case of high-frequency interference signals, a reduction of the amplitudes of the voltages V34$_1$, V34$_2$ compared to the amplitudes that would be produced without the presence of the low-pass filters.

The low-pass filters illustrated in FIG. 7 are operative at the input of the differential amplifier 5. In the case of a realization of the differential amplifier 35 in accordance with FIG. 5 or in accordance with FIG. 6, low-pass filters can also be connected upstream of the inputs of the output stage 38. This is illustrated by dashed lines in FIG. 6. In this example, a first capacitor 62$_1$ is connected between the first input 381 of the output stage 38 and the second output node 22 and a second capacitor 62$_2$ is connected between the second input 382 of the output stage 38 and the second output node 22. Said two capacitors 62$_1$, 62$_2$ form, together with the resistors 371$_1$, 371$_2$ of the current-voltage converter 37, a respective low-pass filter. The cutoff frequencies of said low-pass filters can correspond to the cutoff frequencies of the low-pass filters explained with reference to FIG. 7.

Figure 8:
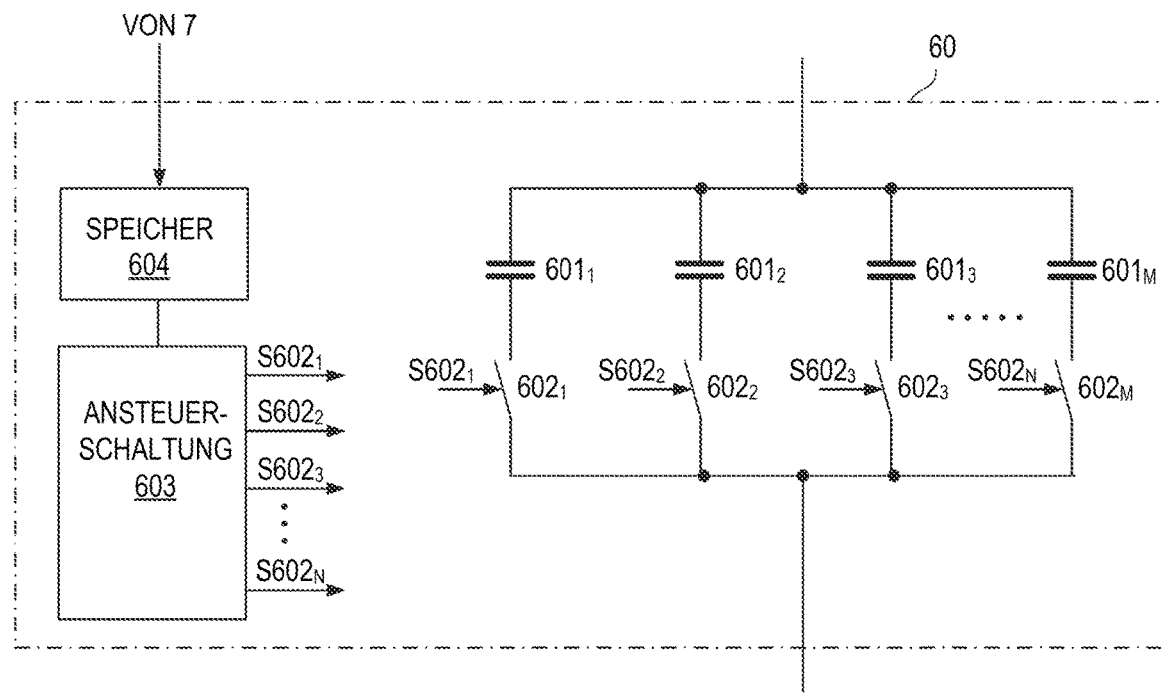
FIG. 8 shows an example of a capacitor, which can be used in the differential amplifier arrangement in accordance with FIGS. 6 and 7 and which has a capacitor arrangement having a plurality of deactivatable capacitor elements.

In accordance with one example, the capacitors 61$_1$, 61$_2$, 62$_1$, 62$_2$ explained above are settable (trimmable) capacitors, in order to be able to set or match the capacitance value thereof to one another. A settable capacitor comprises, for example, a plurality of capacitance elements connected in parallel of which one or more are activatable or deactivatable. One example of such a settable capacitor is illustrated in FIG. 8. The reference sign 60 in FIG. 8 represents any desired one of the capacitors 61$_1$, 61$_2$, 62$_1$, 62$_2$ explained above. As is illustrated in FIG. 8, the settable capacitor comprises a plurality of capacitance elements 601$_1$-601$_M$, which are connected in parallel and with which a respective electronic switch 602$_1$-602$_M$ is connected in series. The individual capacitance elements 601$_1$-601$_M$ can be activated or deactivated by the switches 602$_1$-602$_M$. The individual switches 602$_1$-602$_M$ are switched on or switched off by a drive circuit 603 depending on information stored in a memory 604, in order to activate or to deactivate the capacitance elements 601$_1$-601$_M$ as a result. A total capacitance of the capacitor 60 is dependent on which of the capacitance elements 601$_1$-601$_M$ are activated. After the production of the integrated circuits, the capacitance values of the individual capacitors are measured, for example, by the test circuit 7 and the test circuit 7 then programs the memory 604 in order to set the capacitance of the individual capacitors.

Figure 9:
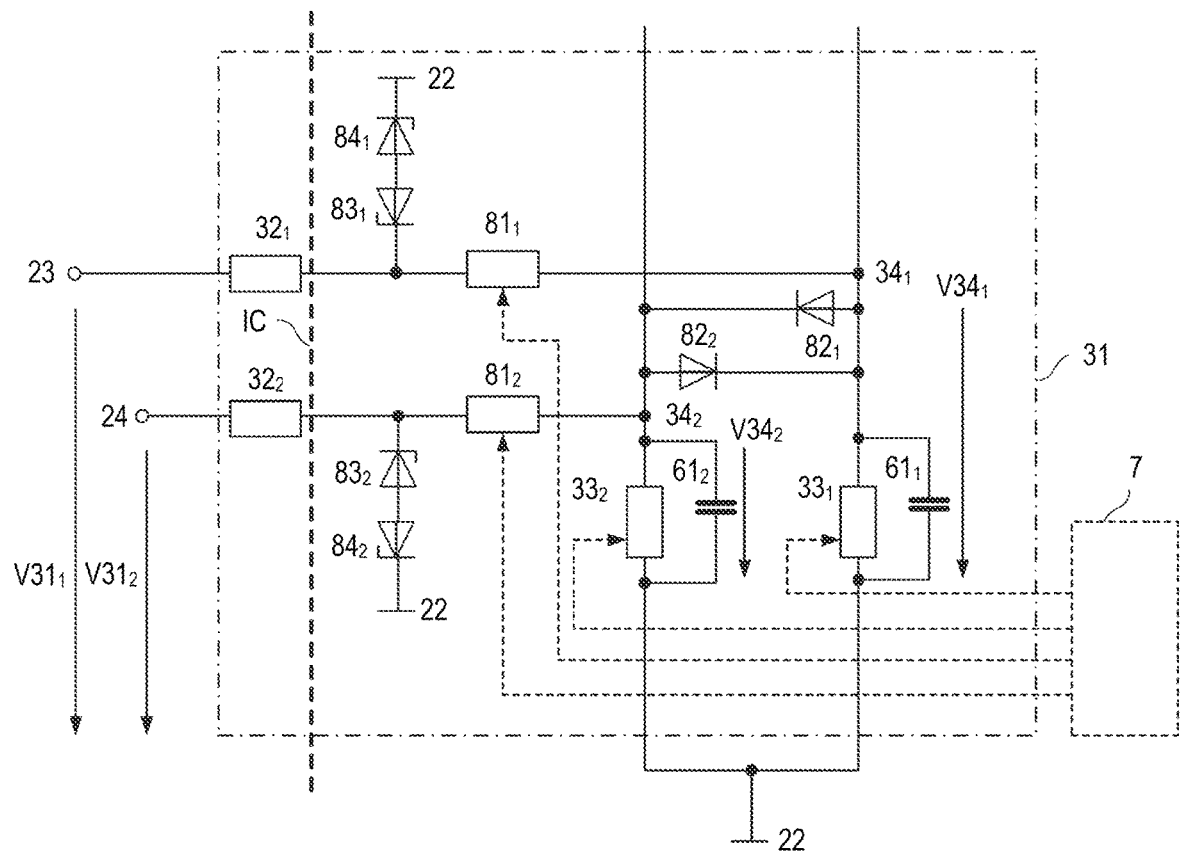
FIG. 9 shows an input stage in accordance with FIG. 3, which additionally has ESD (electrostatic discharge) protection elements.

FIG. 9 shows a further modification of the input stage 31. In this example, the input stage 31 comprises a plurality of ESD protection elements. In the illustrated example, said ESD protection elements comprise two diodes 82$_1$, 82$_2$ connected in antiparallel between the taps 34$_1$, 34$_2$ of the voltage dividers and in each case two Zener diodes 83$_1$, 84$_1$ and 83$_2$, 84$_2$ connected in antiseries between the inputs of the integrated circuit IC and the second output node 22. The "inputs of the integrated circuit" are the circuit nodes between the first resistors 31$_1$, 31$_2$ and the taps 34$_1$, 34$_2$ of the voltage dividers. Furthermore, resistors 81$_1$, 81$_2$ are connected between the (external) first resistors 32$_1$, 32$_2$ and the taps 34$_1$, 34$_2$. Said resistors 81$_1$, 81$_2$ are integrated resistors, which are, for example, settable (trimmable).

Said resistors 81$_1$, 81$_2$ are part of the voltage dividers and serve to limit the currents flowing between the taps 34$_1$, 34$_2$ via the diodes 82$_1$, 82$_2$ in the case of an ESD event.

Figure 10:
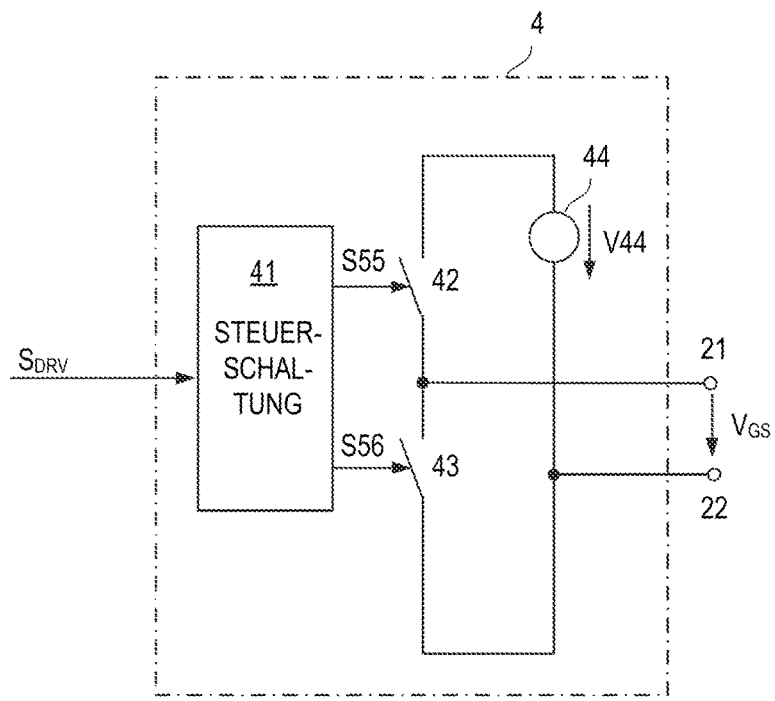
FIG. 10 shows an example of a driver circuit of the drive circuit.

FIG. 10 shows an example of the driver circuit 4. The driver circuit 4 shown in FIG. 10 comprises a control circuit 41, which is fed the drive signal S$_{DRV}$ and which is designed to drive a first switch 42 and a second switch 43 depending on the drive signal S$_{DRV}$. The first switch is connected in series with a voltage source 44, wherein the series circuit having the first switch 42 and the voltage source 44 is connected to the first output node 21 and the second output node 22 so that, when the first switch 42 is closed, the drive voltage V$_{GS}$ corresponds to a voltage V44 provided by the voltage source 44. A voltage level of said voltage V44 is selected so that it is higher than the threshold voltage of the transistor component (which is not illustrated in FIG. 14).

The second switch 43 is connected between the first output node 21 and the second output node 22 so that, when the second switch 43 is closed, the two output nodes 21, 22 are short-circuited, that is to say the drive voltage V$_{GS}$ is essentially 0 V. The control circuit 41 is designed to switch on the first switch 42 and to switch off the second switch 43 when the drive signal S$_{DRV}$ has a signal level indicating that the transistor component 1 should be switched on. The control circuit 41 is furthermore designed to close the second switch 43 and to open the first switch 42 when the drive signal S$_{DRV}$ has a signal level indicating that the transistor component 1 should be switched off.

Figure 11:
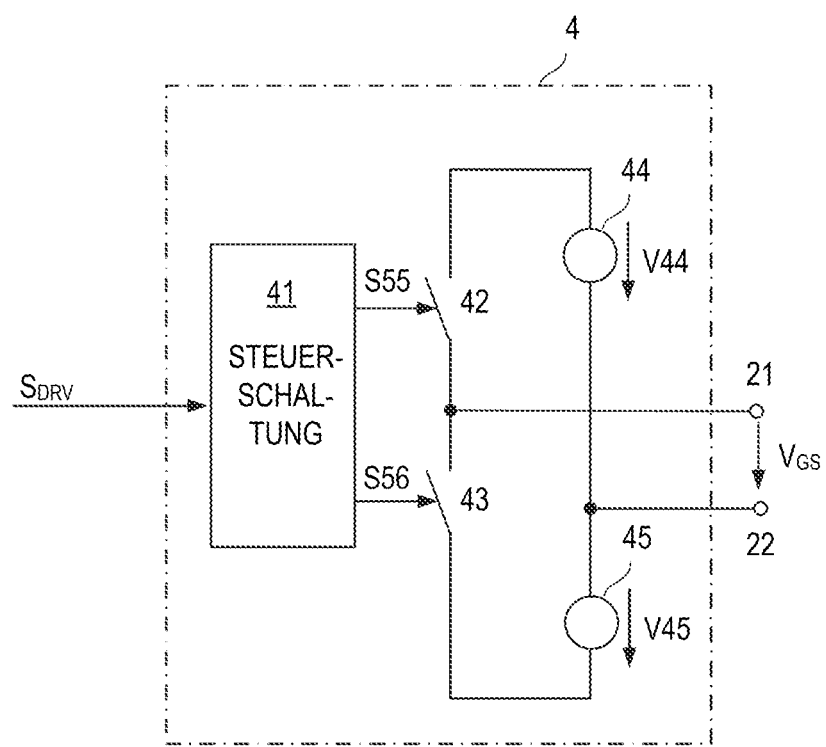
FIG. 11 shows a further example of the driver circuit.

FIG. 11 shows a modification of the driver circuit 4 shown in FIG. 10. In this example, the second switch 43 is connected in series with a second voltage source 45, which provides a second voltage V45, wherein a series circuit of said second voltage source 45 and of the second switch 43 is connected between the first and second output node 21, 22 so that, when the second switch 43 is closed, the drive voltage V$_{GS}$ corresponds to the inverted second voltage, as −V45. In this driver circuit, a negative drive voltage V$_{GS}$ can thus be set to switch off the transistor component 1.

The first and second voltage sources shown in FIGS. 7 and 8 are, for example, part of a voltage supply circuit 5, which is illustrated in FIG. 1 using dashes. Said voltage supply circuit 5 is connected between a supply terminal 25 and the second output terminal 22 and is designed to receive a supply voltage $V_{SUP}$, which is referred to the potential at the second output terminal, and to generate therefrom internal supply voltages for the drive circuit 2, such as, for example, the voltages V44, V45 in accordance with FIGS. 7 and 8 or the supply voltage V3 for the differential amplifier arrangement 3.

Figure 12:
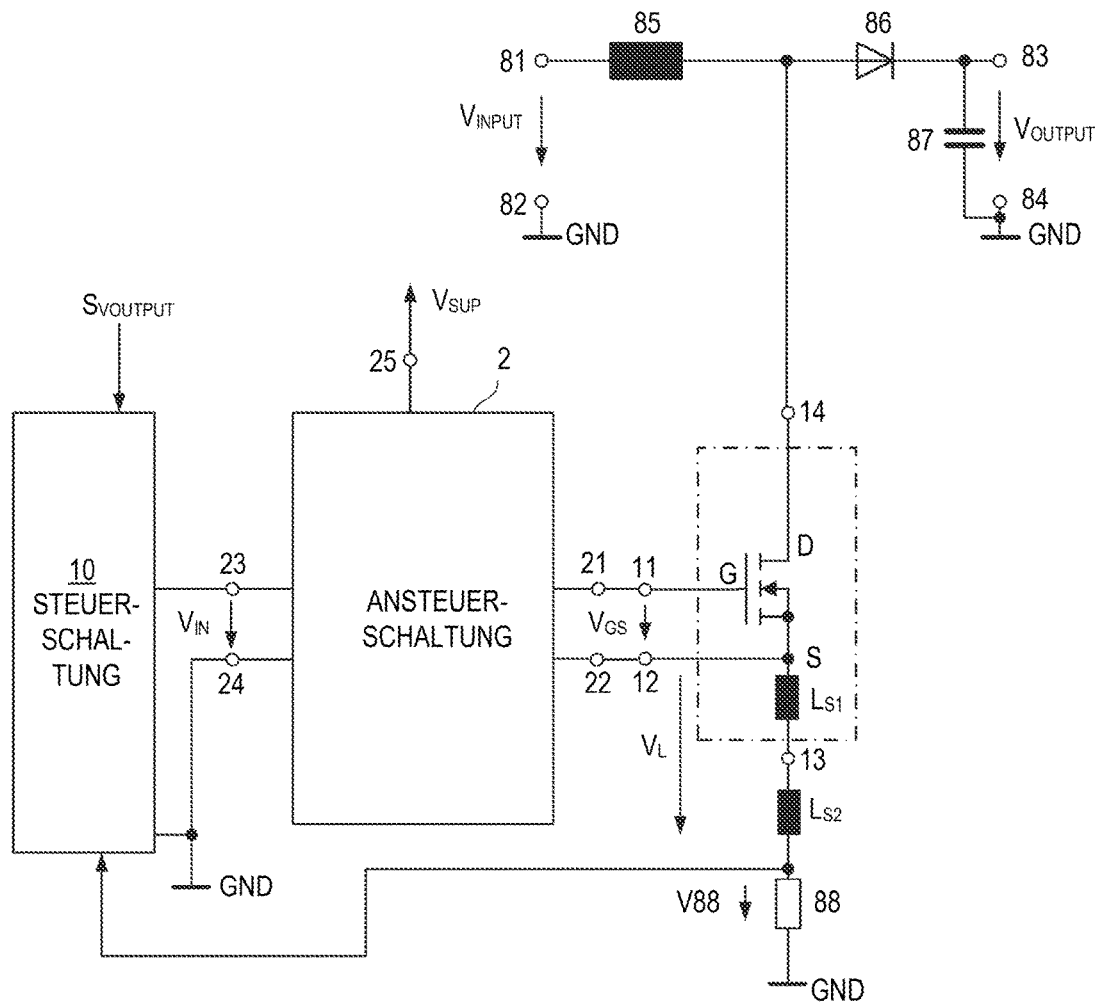
FIG. 12 shows an example of a voltage converter, which has a transistor component and a drive circuit in accordance with FIG. 1.

A circuit having a drive circuit 2 and a transistor component 1, as is shown, for example, in FIG. 1, can be used, for example in a boost converter, such as, for example, a boost converter of a PFC (power factor correction) stage. One example of such a boost converter is shown in FIG. 12.

The boost converter comprises an input 81, 82 for receiving an input voltage $V_{INPUT}$, which is referred to the reference potential GND, and an output 83, 84 for providing an output voltage $V_{OUTPUT}$, which is referred to the reference potential GND. Said output voltage $V_{OUTPUT}$ can be fed to a load (not illustrated). An output capacitor 87 connected between output terminals 83, 84 of the output is optional and can serve to stabilize the output voltage $V_{OUTPUT}$. The load path of the transistor component 1 is connected in series with an inductance 85, such as, for example, an inductor, wherein said series circuit is connected between a first input terminal 81 of the input and the node for the reference potential GND. A measurement resistor (shunt resistor) is optionally connected in series with the load path of the transistor component 1. A rectifier element is connected between a circuit node, to which the transistor component 1 and the inductance 85 are connected, and a first 83 of the output terminals.

The control circuit 10 generates the input signal $V_{IN}$ of the drive circuit 2 as a pulse-width-modulated signal having a variable duty cycle and regulates the output voltage $V_{OUTPUT}$ by setting the duty cycle. The transistor component 1 switches on and off in the manner explained above according to the input signal $V_{IN}$, wherein, when the transistor component 1 is switched on, energy is stored magnetically in the coil and the stored energy is then transmitted to the output via the rectifier element 86 when the transistor component 1 is switched off. To regulate the output voltage, the control circuit 10 receives at least one output voltage signal $S_{VOUTPUT}$, which represents the output voltage. In accordance with one example, the control circuit 10 also receives a voltage via the measurement resistor 88, which represents a load current through the transistor component 1 and which can be used as a further parameter for the regulation of the output voltage $V_{OUTPUT}$.

The invention claimed is:

1. A drive circuit comprising:
    an output, which is designed to be connected to a drive input of a transistor component and which has a first output node and a second output node;
    an input, which is designed to receive an input signal, which is referenced to a reference potential, and which has a first input node and a second input node;
    a differential amplifier arrangement, which is connected to the first input node, the second input node, and the second output node, and which is designed to generate a drive signal based on the input signal; and
    a driver circuit, which is designed to receive the drive signal and to generate a drive voltage between the first and second output nodes based on the drive signal.

2. The drive circuit according to claim 1, in which the differential amplifier arrangement includes:
    an input stage, which is connected to the first input node, the second input node, and the second output node;
    a differential amplifier including an input, which is connected to the input stage, and an output, which is designed to provide the drive signal.

3. The drive circuit according to claim 2, in which the input stage includes:
    a first voltage divider, which is connected between the first input node and the second output node and which includes a tap; and
    a second voltage divider, which is connected between the second input node and the second output node and which includes a tap,
    wherein the tap of the first voltage divider is connected to a first node of the input of the differential amplifier and the tap of the second voltage divider is connected to a second node of the input of the differential amplifier.

4. The drive circuit according to claim 3, in which
    the first voltage divider includes a first resistor connected between the first input node and the tap of said first voltage divider and a second resistor connected between the tap of said first voltage divider and the second output node and
    the second voltage divider has a first resistor connected between the second input node and the tap of said second voltage divider and a second resistor connected between the tap of said second voltage divider and the second output node.

5. The drive circuit according to claim 4, which is partly designed as an integrated circuit (IC),
    wherein the respective second resistors of the first and second voltage divider are integrated in the integrated circuit (IC) and the respective first resistors of the first and second voltage divider are arranged outside of the integrated circuit.

6. The drive circuit according to claim 5, in which the first voltage divider includes a third resistor, which is connected between the first resistor and the tap of the first voltage divider and which is arranged in the integrated circuit (IC) and the second voltage divider includes a third resistor, which is connected between the first resistor and the tap of the second voltage divider and which is arranged in the integrated circuit.

7. The drive circuit according to claim 6, in which each third resistor of the first and second voltage divider includes a resistor arrangement comprising a plurality of activatable and deactivatable resistor elements.

8. The drive circuit according to claim 4, in which the input stage includes:
    a first capacitor, which is connected in parallel with the second resistor of the first voltage divider; and
    a second capacitor, which is connected in parallel with the second resistor of the second voltage divider.

9. The drive circuit according to one of claim 4, in which each second resistor of the first and second voltage divider includes a resistor arrangement comprising a plurality of activatable and deactivatable resistor elements.

10. The drive circuit according to claim 3, in which the differential amplifier includes an operational amplifier.

11. The drive circuit according to claim 3, in which the differential amplifier includes:
    a differential input stage including an input, which forms the input of the differential amplifier, and an output;
    a current-voltage converter, which is connected to the output of the differential input stage; and a differential output stage, which is connected to a first tap and a second tap of the current-voltage converter and is designed to provide the drive signal.

12. The drive circuit according to claim 11, in which the differential input stage is designed to generate a first output current and a second output current, which each flow in the current-voltage converter, in such a way that a difference between the second output current and the first output current is dependent on a voltage between the tap of the first voltage divider and the tap of the second voltage divider.

13. The drive circuit according to claim 12, in which the differential output stage is designed to generate the drive signal depending on a voltage between the taps of the current-voltage converter.

14. The drive circuit according to claim 12, in which the current-voltage converter includes:
   a first resistor, which is designed to have the first output current of the differential input stage or a current proportional thereto flow through it and which is connected between the first tap of the current-voltage converter and a terminal for a supply potential; and
   a second resistor, which is designed to have the second output current of the differential input stage or a current proportional thereto flow through it and which is connected between the second tap of the current-voltage converter and the terminal for the supply potential.

15. The drive circuit according to claim 11, in which the differential output stage includes a Schmitt trigger.

16. The drive circuit according to claim 11, in which the differential amplifier includes:
   a current source, which is connected to one of the taps of the current-voltage converter.

17. The drive circuit according to claim 11, in which the differential amplifier includes:
   a first capacitor, which is connected to the first tap of the current-voltage converter, and a second capacitor, which is connected to the second tap of the current-voltage converter.

18. The drive circuit according to claim 1, further comprising:
   a supply terminal, which is designed to receive a supply voltage, which is referenced to the second output node.

19. The drive circuit according to claim 18, further comprising a supply circuit, which is connected between the supply terminal and the second output node and which is designed to generate at least one internal supply voltage based on the supply voltage received between the supply terminal and the second output node.

20. A circuit comprising:
   a drive circuit comprising:
      an output, which is designed to be connected to a drive input of a transistor component and which has a first output node and a second output node,
      an input, which is designed to receive an input signal, which is referenced to a reference potential, and which has a first input node and a second input node,
      a differential amplifier arrangement, which is connected to the first input node, the second input node, and the second output node, and which is designed to generate a drive signal based on the input signal, and
      a driver circuit, which is designed to receive the drive signal and to generate a drive voltage between the first and second output nodes based on the drive signal; and
   the transistor component comprising a first load terminal and a second load terminal.

21. The circuit according to claim 20, in which the transistor component further comprises:
   a semiconductor chip;
   a housing, in which the semiconductor chip is arranged, wherein the drive input and the first and second load terminal are accessible from outside the housing;
   in the housing on the semiconductor chip, an internal first load terminal, an internal second load terminal and an internal control terminal,
   wherein the drive input includes a first control terminal, which is connected to the internal control terminal, and a second control terminal, which is connected to the internal first load terminal, and
   wherein the first load terminal is connected to the internal first load terminal and the second load terminal is connected to the internal second load terminal.

22. The circuit according to claim 20, in which the transistor component includes a MOSFET.

* * * * *